(12) United States Patent
Kwinten et al.

(10) Patent No.: US 8,257,912 B2
(45) Date of Patent: Sep. 4, 2012

(54) PHOTOLITHOGRAPHY

(75) Inventors: Hans Kwinten, Luyksgestel (NL); Peter Zandbergen, Hechtel-Eksel (BE); David Van Steenwinckel, Holsbeek (BE); Anja Vanleenhove, Kessel-Lo (BE)

(73) Assignee: NXP B.V., Eindhoven (NL)

( * ) Notice: Subject to any disclaimer, the term of this patent is extended or adjusted under 35 U.S.C. 154(b) by 528 days.

(21) Appl. No.: 12/375,945

(22) PCT Filed: Jul. 31, 2007

(86) PCT No.: PCT/IB2007/053014
§ 371 (c)(1),
(2), (4) Date: Feb. 2, 2009

(87) PCT Pub. No.: WO2008/015635
PCT Pub. Date: Feb. 7, 2008

(65) Prior Publication Data
US 2009/0311623 A1 Dec. 17, 2009

(30) Foreign Application Priority Data
Aug. 2, 2006 (EP) .................................. 06118304

(51) Int. Cl.
*G03F 7/26* (2006.01)
(52) U.S. Cl. ..................................................... 430/325
(58) Field of Classification Search .................. 430/322, 430/328, 270.1, 325, 337
See application file for complete search history.

(56) References Cited

U.S. PATENT DOCUMENTS

| | | | |
|---|---|---|---|
| 6,171,761 B1 | 1/2001 | Minamide et al. | |
| 6,218,082 B1 | 4/2001 | Yang | |
| 6,338,934 B1 | 1/2002 | Chen et al. | |
| 6,348,297 B1 | 2/2002 | Uetani | |
| 6,395,451 B1 | 5/2002 | Jung | |
| 6,465,160 B1 | 10/2002 | Wang et al. | |
| 6,573,480 B1 | 6/2003 | Rangarajan et al. | |
| 6,767,693 B1 | 7/2004 | Okoroanyanwu | |
| 6,881,524 B2 | 4/2005 | Cauchi et al. | |
| 6,887,646 B1 * | 5/2005 | Fujiwara et al. | 430/270.1 |

FOREIGN PATENT DOCUMENTS

| | | |
|---|---|---|
| CN | 1268680 A | 10/2000 |
| CN | 1289069 A | 3/2001 |
| DE | 10120659 A1 | 11/2002 |
| WO | 2007045498 A1 | 4/2007 |

OTHER PUBLICATIONS

Jung, J. C., et al; "Quencher Gradient Resist Process for Low K Process"; Proceedings of the SPIE, SPIE, Bellingham, VA, US; vol. 5376, No. 1, Feb. 2004; pp. 63-70; XP002341983; ISSN: 0277-786X.

(Continued)

*Primary Examiner* — Cynthia Kelly
*Assistant Examiner* — Caleen Sullivan

(57) ABSTRACT

The invention relates to a method of photolithography comprising the steps of: providing a substrate and forming a layer of a photoresist on the substrate, performing a first exposure in which a predetermined part of the layer of photoresist is irradiated through a mask having a pattern for forming a latent image of said pattern in the layer of the photoresist, performing a pretreatment on the layer of the photoresist to remove a predetermined part of the latent image before performing the fixation. The method provides an improved process window. The invention further relates to a photoresist for use within the method of the invention.

9 Claims, 6 Drawing Sheets

OTHER PUBLICATIONS

Kudo, T., et al; "Illumination, Acid Diffusion and Process Optimization Considerations for 193 NM Contact Hole Resists"; Proceedings of the SPIE, SPIE, Bellingham, VA, US; vol. 4690; Mar. 4, 2002; pp. 150-159; XP008014027; ISSN: 0277-786X.

Lu, Zhijian G., et al; "Selection of Attenuated Phase Shift Mask Compatible Contact Hole Resists for KrF Optical Lithography"; Proceedings of SPIE—The International Society for Optical Engineering 1999 Society of Photo-Optical Instrumentation Engineers, Bellingham, WA, US; vol. 3678, No. II; 1999; pp. 923-934; XP00247790.

* cited by examiner

PHOTOLITHOGRAPHY

FIELD OF THE INVENTION

The invention relates to a method of photolithography.
The invention further relates to a photoresist suitable for use in the method.

BACKGROUND OF THE INVENTION

Photolithography is used in the manufacture of semiconductor devices. With photolithography, a pattern within a mask (or reticle in a step-and-repeat projection system) is replicated in a layer of photoresist that has been applied on top of a substrate by first exposing the photoresist layer to actinic radiation through the mask therewith forming a pattern related latent image within the layer of photoresist. The term actinic relates to the property of radiant energy by which photochemical modifications are produced. Subsequently, the latent image is fixed to become a (permanently registered) image within the exposed layer of photoresist. Usually this is achieved through a heating step called a post exposure bake (PEB). After fixation, the image is developed to create a relief layer of the image pattern. In this development step, the photoresist layer is removed, which have been modified during the predevelopment part of the photolithography process to an extent beyond the development threshold. The relief pattern may serve as a mask in further semiconductor process steps such as doping or etching.

In photolithography, exposure resolution is an important parameter. A phase shifting mask (PSM) provides improved exposure resolution, without adding complexity to the mask design and manufacture. It is common to use so called attenuated PSM (attPSM) for replication of contact holes or vias in semiconductor manufacturing.

The improved resolution of the PSM originates from its areas of different transparency, which create phase differences in the transmitted light leading to diffraction. The diffraction phenomenon results in sharper contrast for the main feature of the pattern to replicate. However, it is the same diffraction phenomenon that generates unwanted intensity of light at positions other than those necessary for replicating the main features of a pattern in an attPSM. These unwanted intensities are called side-lobes and they contaminate the final relief mask pattern with unwanted side-lobe features.

In U.S. Pat. No. 6,465,160 B1 a method is disclosed to mitigate the generation of side-lobes in a photolithography process. In this method the parameters of the photolithography process are adjusted in order to increase the contrast of the photoresist pattern. The parameters particularly include the time and temperature of the soft-bake, performed before exposure, and/or of the post exposure bake (PEB).

However, when using PSM or attPSM for replicating dense arrays of contact holes, side-lobes originating from the main features, being the neighboring contact holes, overlap. As a consequence, the side-lobe problem is worsened to such an extent that the method disclosed in U.S. Pat. No. 6,465,160 B1 does not suffice to prevent the problem.

SUMMARY OF THE INVENTION

It is an object of the present invention to provide a photolithography technology which results in an improved process window.

In one aspect of the invention the object is achieved with a method of photolithography as specified in claim 1 which is characterized in that it comprises the step of performing a pretreatment on the exposed layer of the photoresist to remove a predetermined part of the latent image before performing the fixation.

The invention is based on the consideration that during replication of a mask pattern within a layer of photoresist the latent image, not yet being permanently registered within this photoresist layer, can be manipulated and altered during a pretreatment step by performing this pretreatment after the exposure and before the fixation. The pretreatment thus has the effect of reducing and/or removing, and/or canceling out and/or counterbalancing part of the effect of the exposure to such an extent that undesired (predetermined) parts of the latent image, such as the side-lobes, are not reproduced in the relief layer. In this context, it is important to recognize that the latent image consists of a concentration profile of a modification of the photoresist brought about by the exposure, which extends throughout the layer of photoresist along the directions spanning the surface of the substrate comprising the layer of photoresist. The modification can be of physical or chemical nature such that it can be exploited in further processing steps to result in the relief image having a pattern conform the profile of the modification after development. If the concentration of a modification in one region of the layer of photoresist is higher than the concentration representing the development threshold, then, the corresponding pattern feature in that region will be reproduced during development.

In general, main pattern features will be represented by relatively large differences between modification concentrations in neighboring regions of the layer of photoresist, while the unwanted features are represented by relatively low such differences; at least lower than those representing the main features. Therefore, advantageously, the pretreatment does not need to be distinctive in the sense that it must exclusively operate on those regions of modifications representing the unwanted parts of the latent image. The pretreatment is allowed to effect the part of the latent image representing the main features to the extent that unwanted modifications are reduced to or counter balanced to below the development threshold level, while the main feature modifications of the latent image are satisfactorily replicated in the final relief pattern. Thus, the pretreatment does not need expensive and complicated masking.

The phrase "before performing the fixation" means that fixation must not occur to substantial extent during pretreatment. Although preferably fixation is prevented entirely during pretreatment in order to give the best improvement of process window, in cases where some fixation is unavoidable, fixation is only allowed to such an extent that after the pretreatment, the unwanted parts of the latent image do not develop. Those skilled in the art will appreciate the need for some optimization of parameters of the invention to obtain the best effect.

The advantage of the invention is in that the process window is improved and the side-lobe features as well as other unwanted features may be reduced, or in some embodiments even removed, or avoided. Furthermore, higher transparency PSM masks may be used to improve resolution. Expensive solutions such as optical proximity corrections on mask may be reduced or avoided. Existing photoresist formula's may be used to obtain improved results without having to change process flows or equipment during semiconductor manufacturing.

In an embodiment, the fixation comprises maintaining of the layer of photoresist at a first temperature, which is equal to or above a threshold temperature, for a predetermined first period and that the pretreatment comprises maintaining of the layer of photoresist at a second temperature, which is lower than the threshold temperature, for a predetermined second period.

In the present embodiment, the latent image is fixed by subjecting the photoresist layer to a first temperature higher than or equal to a certain threshold temperature during a first period. It is therefore advantageous that the pretreatment is performed at a second temperature below this threshold temperature in order to prevent significant fixation. The first temperature is usually specified by the photoresist vendor and at least higher than the threshold temperature. With a pretreatment as specified in the present embodiment, the fixation is slowed down, prevented or reduced, while other physical or chemical processes with which the unwanted parts of the latent image can be reduced or counterbalanced to below the development threshold are suitably accelerated and/or activated.

The threshold temperature may represent a defined temperature or a temperature range below or within which the fixation proceeds so slowly that within at least part of the pretreatment, fixation of an unwanted part of a latent image occurs only to an extent below the development threshold. Generally, processes for bringing about physical or chemical modifications are governed by activation temperatures. Through reaction kinetics theory, the activation temperature translates into a time window within which pretreatment can be performed without substantial fixation depends on a temperature range. Often, the threshold temperature can be defined by the photoresist vendor.

The temperature profile can be chosen according to need. The profile can be tuned to hardware needed for the heating or cooling. Thus a single temperature pretreatment as well as a single temperature fixation can be done using two heating devices. Alternatively, a profile wherein the temperature increases during the first period such as to link to the temperature of the fixation may be done with a single hardware device, therewith simplifying the process device structures.

In an embodiment, the method wherein the latent image is formed as a pattern of a modification of the photoresist which modification has an effect that is exploited for selective removal of a part of the layer of photoresist during development and the photoresist comprises a quencher, is characterized in that during the pretreatment, the quencher diffuses through the layer of photoresist and is at least partly, consumed in a process by which the effect is, at least partly, counterbalanced or cancelled out.

In this embodiment, the modification effect can for example be a change of solubility or volatility of the photoresist layer material. It is advantageous when the photoresist comprises a quencher which is able to at least partly counterbalance or cancel out the effect during the process of the pretreatment and which is consumed in this process. Herein consumed means not existing in its original form. The consumption causes that a quencher profile in the sense of the modification profile is created such that a concentration gradient of quencher is created along the dimensions in which the layer extends along the substrate surface. Depending on the exposure dosage, some regions such as the exposed regions will have a net concentration of modification (main pattern features) while in other regions such as part of the unexposed regions present in between and adjacent to the exposed regions, a net amount of quencher results. The pretreatment step advantageously induces diffusion of quencher against this concentration gradient in order to displace quencher to areas of net modification concentration and help reduce or cancel out the effect of net modification concentration. Therewith, in this embodiment initially unused quencher is activated by the pretreatment to participate in the canceling out or counterbalancing process.

As the modification level in the unwanted part of the latent image is lower than that in the desired part of the latent image, the pretreatment is adjusted such that only the unwanted latent image part is reduced or counterbalanced to below development threshold level.

In the embodiment, advantage is taken from the diffusion of quencher during the pretreatment. The method is applicable to commercially available and/or conventional photoresists without having to alter them in any way. A high rate of diffusion of the quencher is advantageous for reducing the time duration of the pretreatments step if the diffusion is the rate limiting step of the process for counter balancing and/or canceling out.

The quencher may be any substance which is able to perform the described function during the pretreatment. There may be one quencher, but alternatively, multiple quenchers may be present. The advantage in the latter case is that different quenchers may have different properties for optimization of the quenching function during the pretreatment.

In an embodiment, the photoresist comprises a photoactive compound for generating the modification in the form of a catalyst that catalyzes an irreversibly transformation within the photoresist during fixation, and during the pretreatment, the quencher disables the catalyst at least partly.

During the exposure the photoactive compound generates a catalyst for catalyzing a process by which the latent image is converted into an image within the layer of photoresist during fixation. Advantageously, the quencher only needs to deprive at least part of the amount of catalyst from its fixation function during the pretreatment in order to counterbalance or at least partly cancel out the effect of the modification. As in the previous embodiment, it is preferred that the quencher is at least partly consumed during the process of canceling out the effect of the modification and that the quencher can diffuse through the layer of photoresist.

It is preferable that the rate of diffusion of the quencher is higher than that of the catalyst, since this prevents smearing and/or loss of resolution of the latent image during the pretreatment.

In an embodiment, the catalyst is an acidic species and the quencher is a base. Numerous commercially available photoresists comprise a photoactive compound in the form of a photoacid generator, which upon exposure generates an acidic catalyst and therewith the modification of photoresist. The catalyst catalyses one or more, usually irreversible, chemical reaction(s) for converting the latent image during fixation. In this case the quencher may be a suitable base able to neutralize the acid by reacting with it. Multiple quenchers with multiple chemical function or nature may be present.

In an embodiment, the latent image is made up of a pattern of a modification of the photoresist which modification has an effect that is exploited for selective removal of a part of the layer of photoresist during development and the photoresist comprises a quencher precursor, which during the pretreatment provides a quencher that at least partly counterbalances or cancels out, the effect.

In this embodiment, the quencher is not provided as such within the photoresist. In stead it is present within the photoresist in latent form. This has the advantage that the quencher can be generated in situ in a desired concentration during the pretreatment. Therewith, it provides improved freedom over the pretreatment process parameters.

The quencher precursor preferably is designed such as to respond to predetermined stimuli such as for example heat, radiation or sound with which the release of the quencher can be induced, without substantially stimulating the photoactive compound used during the exposure to generate the latent image. Preferably, the stimuli used during the pretreatment are also different from those used during the fixation in order to efficiently decouple the effects achieved with the pretreatment and the fixation.

It is not necessary that during the exposure the quencher is not released, as long as a sufficient net concentration of the modification of the photoresist is generated to form a latent image.

During the pretreatment, the release of quencher may be done in selective areas of the photoresist layer. In one variation, the pretreatment is however such that the quencher is released throughout the layer of photoresist. This provides easy mask-less pretreatment processes. In addition, the excess quencher in non-exposed regions can be made to diffuse and help reduce the unwanted features to develop as described here before.

Diffusion of the quencher is however not a necessity, as the quencher can be, or is advantageously generated in the regions where needed during the pretreatment to perform its function. Therewith a temperature raise during the pretreatment can be omitted and for example concomitant unwanted catalyst diffusion in case the photoresist is a chemically amplified photoresist is prevented such that resolution of the final replicated image is improved.

In an embodiment, the quencher precursor is a photoactive compound and the pretreatment comprises performing a pretreatment exposure with actinic radiation by which the quencher precursor provides the quencher.

Release of quencher using a pretreatment exposure offers the advantage of efficient decoupling of the effect of the pretreatment from that of the fixation, for example when the fixation occurs through heat exchange such as in a post exposure bake. Furthermore, although not always necessary for reasons as described in the previous embodiment, the effect of the exposure and pretreatment exposure can also be efficiently decoupled. This is ensured by designing the photoactive compound and the quencher precursor such that they are stimulated with different actinic radiation. Preferably the pretreatment exposure is done with radiation less intensive and/or of longer wavelength than that of the exposure As disclosed in Microelectronic Engineering 35 (1997) 169-174 a method of photolithography is known that uses a two step post exposure bake for improving the lithographic performance of the chemically amplified photoresist, UVI-IHS™ from Shipley Company. With this process, post exposure bake at low temperature allows the deprotection reaction to go to completion, with minimal acid diffusion into unexposed portions of the resist; and the high temperature post exposure bake makes it possible to average out the standing waves.

Although the low-temperature post exposure bake step can be interpreted as a pretreatment, it would be a pretreatment not according to the invention, since the deprotection reaction of the prior art document corresponds to the fixation reaction of the present invention. Hence the aim of the prior art document is completely different, i.e whereas in the prior art method fixation must go to completion during the low temperature post exposure bake step, according to the present invention the opposite situation applies for the pretreatment.

In one aspect of the invention the photoresist comprises a photoactive compound that releases a photoproduct upon exposure with actinic radiation, the photoproduct inducing a modification of the photoresist and the photoresist comprising a quencher being able to at least partly counterbalance or cancel out the modification in a process wherein the quencher is at least partly consumed, the quencher being able to diffuse through said layer of photoresist at higher rate than the photoproduct.

A photoresist as specified in the present embodiment allows improved process window when used in a method according to the present invention. During the pretreatment, the relatively fast rate of diffusion of the remaining quencher with respect to that of the photoproduct generated after exposure, which forms the pattern of a latent image in a layer of the photoresist, allows efficient distribution of the quencher and suppression of the effect of the photoproduct, without substantial diffusion of the photoproduct due to its slow rate. Therewith the photoresist according to the invention provides improved resolution when used in a photolithography process as specified by the invention.

In one aspect of the invention the photoresist comprises a photoactive compound that releases a photoproduct upon exposure with actinic radiation, the photoproduct inducing a modification of the photoresist and the photoresist comprising quencher precursor that releases a quencher upon a physical stimulation to at least partly counterbalance or cancel out the modification.

The use of a photoresist as specified in the present embodiment in a method according to the invention allows to generate the quencher in situ during the pretreatment, therewith advantageously making a provision for substantial diffusion of the photoresist superfluous.

The photoresists of the previous two embodiments provide improved resolution when used in a photolithography process as specified by the invention.

BRIEF DESCRIPTION OF THE DRAWINGS

These and other aspects of the invention will be further exposure elucidated with reference to the figures, in which.

DESCRIPTION OF THE EMBODIMENTS

Photolithography is a well known technology widely used during semiconductor device manufacture. A general description is provided in for example chapters 12 and 13 of Silicon processing for the VLSI Era Volume 1 Process Technology $2^{nd}$ edition Lattice Press 2000 by S. Wolf and R. N. Tauber, hereinafter to be referred to as ref. 1.

Figure 1:
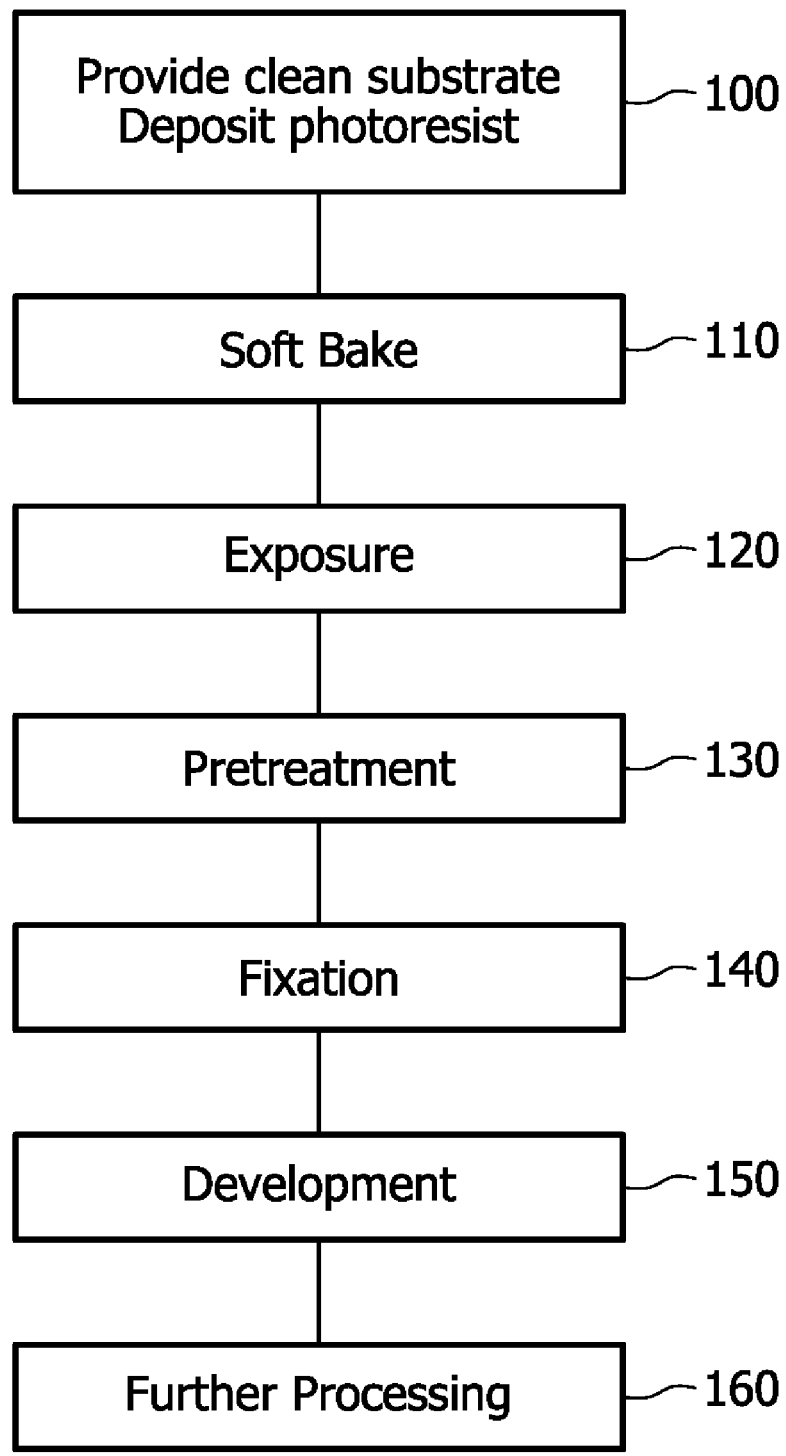
FIG. 1 represents a flow chart of a photoresist process according to an embodiment of the invention.

A general flow chart of a photoresist process according to the invention is shown in FIG. 1. The essential part of the invention which distinguishes the process form the prior art is the pretreatment (130). It comprises an extra treatment of the photoresist performed between the exposure (120) and the fixation (140). In conventional photoresist processing methods, the fixation comprises a post-exposure bake (PEB) as in ref 1. To explain the working of the present invention, a number of steps of the photoresist processing method will be discussed below. Those steps considered not particularly relevant for the invention will only be briefly exposure lattitudeucidated and some are also not shown in FIG. 1. Those skilled in the art will know how to perform such steps and they are described in prior art such as ref. 1.

The process relies on a photoresist which is a multi-constituent material comprising: a solvent, a matrix material, also called resin, at least one active material such as a radiation sensitive or photoactive compound (PAC) and other additive materials. The solvent allows processing or deposition of the photoresist materials such that a layer of photoresist can be prepared. The matrix is the main photoresist constituent in terms of mass content and serves as a binder establishing the mechanical properties of the photoresist layer during processing and in its final state.

The photoactive compound is the constituent undergoing a chemical reaction in response to exposure with actinic radiation. A multitude of photoactive compounds is available and in use today. They may be separate additives, but can also be part of the resin, they may be small molecules, oligomers or polymers. In a special type of photoresist the photoactive compound releases a catalyst upon the exposure, which catalyses chemical changes within the layer of photoresist during the fixation. Such resists are called chemically amplified (CA) since only a small radiation dosage is necessary for inducing a large number of chemical reactions (approximately 500 to 1000 per molecule of catalyst). The catalyst therefore usually is able to diffuse through the layer of photoresist.

The other additives may serve several functions. One important optional additive is a so called quencher. Amongst other functions it provides a buffer function in chemically amplified photoresists, in which the quencher additive counterbalances, reduces, or quenches the effects of the photochemical changes induced by the photoactive compound upon exposure. In a first aspect it provides an increase of contrast upon exposure.

In a first step 100 of the method a substrate is provided and cleaned before a layer of photoresist is applied onto a surface of the substrate using a suitable deposition process. The nature of the substrate is not essential for the invention and those skilled in the art will choose any substrate according to their desire. Substrates may include semiconductor substrates such as silicon wafers or the like including possible semiconductor devices or, alternatively glass, quartz or sapphire or the like.

The deposition of the layer of photoresist usually is provided through spincoating or printing. However, those skilled in the art will be able to think of other suitable methods. The technique for application of the layer of photoresist is also not essential for the invention.

Usually following the application of the layer of photoresist it is subjected to a heating step called "soft bake", "prebake" or "post-apply bake" 110. This step accomplishes reduction of the solvent concentration within the as applied layer of photoresist to convert the layer into solid form with good adherence to its underground. The soft bake needs careful optimization but is generally performed at a temperature such that the aforementioned goals are achieved in acceptable period of time. Importantly, the soft bake is performed such that minimal disruption of subsequent steps is introduced. In this respect, temperature control is very critical for e.g. the chemically amplified photoresists.

In a further step 120, the layer of photoresist is exposed to actinic radiation through a mask (or reticle in case of a step and repeat lithography system) to create a latent image in the layer of photoresist representing the pattern contained within the mask. The actinic radiation is in principle not specified and can be chosen according to need. In conventional photolithography usually the optical, UV or deep UV spectral region radiation is used. The mask comprises regions of different transparency for the actinic radiation according to the pattern. This causes that different regions of the photoresist layer receive different radiation doses, i.e the photoresist is exposed with a distinct pattern related intensity profile.

The response of the photoactive compound is such that within the photoresist layer an exposure intensity related exposure modification profile is generated. Here the term modification profile represents a distribution of the concentration or the amount per unit volume of photoresist of a modification throughout the layer of photoresist in the dimensions of the surface the layer covers. Hence, the modification profile represents the latent image of the mask pattern in the photoresist. Herein modification is used in a very broad sense; it may mean the altered concentration of the photoactive compound, its product(s) after exposure and/or after chemical reaction with other components of the photoresist as well as the physical or chemical consequences or effects of these. The total degree of modification is adjusted by controlling the exposure energy impinging on the photoresist.

After exposure, according to a conventional prior art photoresist processing method the photoresist layer is subjected to fixation 140, wherein the latent image in the form of the exposure modification profile is converted in the image in the form of a development modification profile. The image, being a development profile without topological contrast, in turn is converted into a relief photoresist mask layer having topological contrast during the development step 150 by exploiting the physical or chemical effects of the development modifications.

An important parameter defined in all profiles is the development threshold. It represents the concentration level of a modification above which a part of a latent image or image will be developed such as to lead to a relief in the relief photoresist mask layer. The threshold is the boundary between parts of images that are replicated or not.

Fixation 140 may be performed in essentially every way desirable as long as the effect is to result in a development modification profile or image suitable for development. Usually the fixation comprises a heating in the form of a so called 'post-exposure bake' (PEB). In case of a chemically amplified photoresist, the product(s) of the activated photoactive compound is a catalyst, which catalyses a photoresist modification reaction. Often, and preferably the latent image is irreversibly fixed within the photoresist layer.

Further processing 160 is performed before the photoresist is used as a mask layer during for example doping or etching processes.

According to the present invention the pretreatment 130 is inserted into the process flow of FIG. 1 between the exposure 120 and the fixation 140. If appropriately performed, the pretreatment can be advantageously used to alter or reshape the latent image before fixation in order to remove faults or other unwanted features in the latent image such as side-lobes and prevent them from being fixed and developed. In the following description its use is exposure elaborated with respect to the side-lobes generated by phase shift masking during exposure.

Phase shift masks (PSM) are extensively used to enhance resolution (Ref 1). A phase shift mask induces phase differences in transmitted radiation such that interference phenomena provide a radiation intensity profile at the photoresist layer that is enhanced with respect to that lacking phase shifting. Attenuated phase shift mask (attPSM) is commonly used for imaging closely spaced contact holes.

Figure 2A:
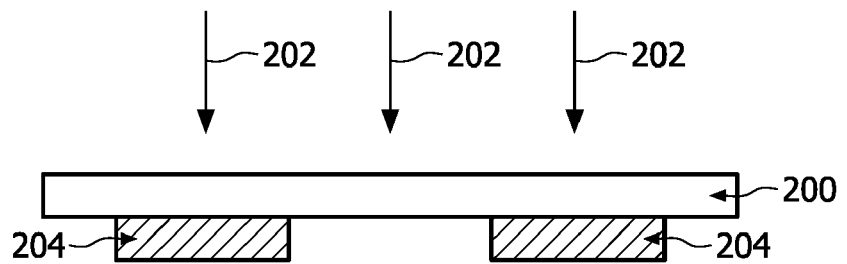
FIGS. 2, 3 and 4 each schematically represent a number of stages of the latent image within a layer of photoresist during a process according to FIG. 1.

FIG. 2A. shows that an attenuated phase shift mask 200, having half-transparent parts 204 for creating the phase differences in incident actinic radiation 202 results in exposure of the photoresist to an intensity profile 206. The intensity profile comprises a main lobe 208 which, when a positive photoresist is used, represents a main feature in the latent image in the photoresist region 210. In this particular case it represents a contact hole. In addition, however, the phase shifting phenomenon causes some radiation intensity to be constructively diffracted to form side-lobes 212 in regions 214. If these side lobe intensities induce modifications within the latent image that surpass the development threshold, they will be replicated and contaminate the relief photoresist mask layer. Those skilled in the art will know that in case contact holes are imaged using the smallest feature dimensions/sizes of a semiconductor manufacturing process, the side-lobes 212 of neighboring contact hole lobes 208 will overlap and reinforce each other engraving the problem.

The absolute intensity of the side-lobes 212 is dependent on the exposure intensity, i.e. lowering the exposure intensity lowers the side-lobes too. A process is optimized by minimizing the exposure intensity such that the side lobe 212 is minimized preventing its development, while the lobe 208 is still properly replicated.

Figure 2B:
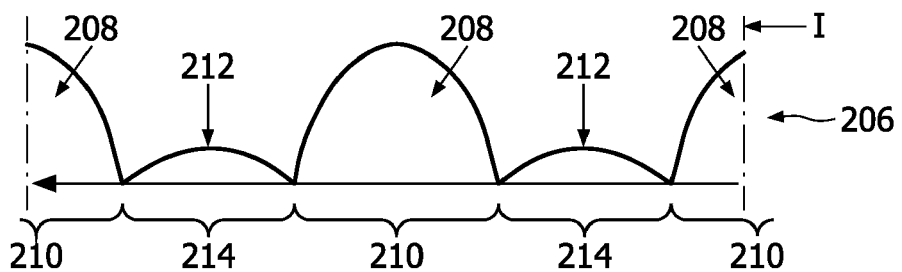
Figure 2C:
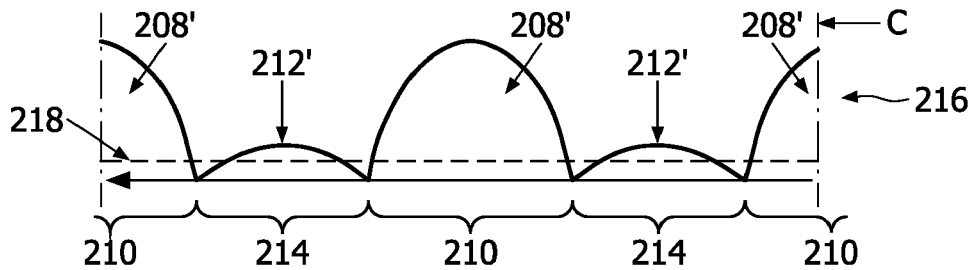

The intensity profile 206 leads to the exposure modification profile 216 defining the latent image with main feature modifications 208' in regions 210 and side lobe modifications 212' in regions 214 that partly exceed the development threshold 218 such that they are replicated in the relief photoresist mask layer. Before this latent image is fixed, the pretreatment step is used to alter this latent image in such a way that the unwanted features such as the side-lobes 212' are reduced to below the development threshold 218 without substantially effecting the main lobe features 208. The result is shown in FIG. 2B.

The pretreatment duration may be chosen according to need and depending on the photoresist system used. Preferably the pretreatment period is short, therewith increasing the number of pretreatments performed per unit time. This may benefit throughput times.

In theory, pretreatment and fixation may be completely decoupled. Thus, the pretreatment may involve physical stimuli that do not interfere with fixation or vice versa. This is a preferable situation since then complete freedom in processing the photoresist is obtained. In practice, both steps are often not completely decoupled. However, some mutual interference is tolerable as long as for example pretreatment does not lead to substantial fixation.

With the above in mind, every pretreatment process for achieving the goal of improving or 'cleaning' the latent image is applicable as long as the profile of the main feature lobe 208' remains acceptably reproducible within the relief photoresist mask layer.

Thus, in an embodiment, complete decoupling may for example be achieved by pretreatment comprising subjecting the exposed layer of photoresist to heat and/or a certain chemical environment while fixation is done using exposure with irradiation. Numerous combinations of pretreatment and fixation with regard to their physical stimuli and time durations and within the scope of the invention can be thought of by the person skilled in the art In an embodiment the pretreatment comprises subjecting the exposed layer of photoresist to a heating procedure during a pretreatment period, while fixation is also done using a heating treatment such as with the post exposure bake. In this embodiment restrictions with respect to temperatures used during pretreatment are imposed by the post exposure bake conditions in order to prevent substantial fixation.

Usually, but not necessarily, the post exposure bake is performed in conformity with the photoresist processing method provided by the photoresist Vendor or as related to its constituents. Since fixation generally will occur through subjecting the exposed layer of photoresist to a temperature higher than some threshold temperature, the restriction involves that pretreatment should occur at temperatures below this fixation temperature. This threshold temperature and/or the post exposure bake temperature may be identical and/or may be specified by the photoresist Vendor.

The pretreatment temperature may be 5, 10, 15, 20, 30, 40 or 50° C. lower than that of the post exposure bake. Preferably it is about 5 to 30° C. lower. Those skilled in the art will know that the critical temperature is often not sharply defined, since the rate at which chemical reactions proceed is continuously dependent on temperature. The best temperature of the pretreatment will therefore have to be determined using some optimization experiments as will be explained further on in the application. The Vendor specified post exposure bake temperature can be used as a starting point for the optimization experiments.

The pretreatment temperature does not have to be constant. Any suitable temperature profile may be used taking into account the restrictions with regard to fixation and development.

The fixation may follow the pretreatment instantly and the temperature profiles of both steps may butt up. Alternatively a cooling period may be in between.

Figure 3A:
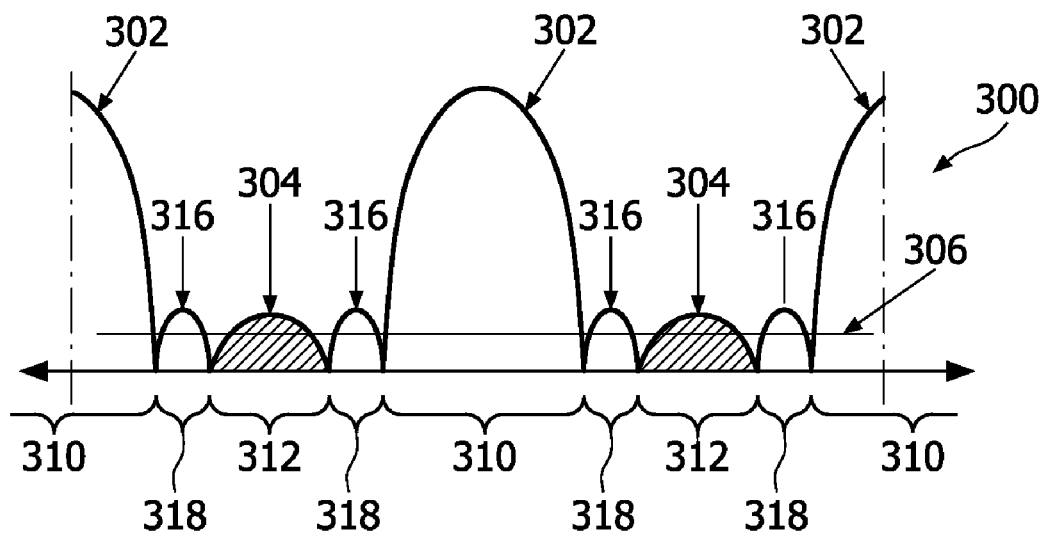

In an embodiment, use is made of a photoresist that comprises additional materials that can be used for reducing the side-lobe modifications 212' during the pretreatment. For example, the photoresist comprises a quencher which is able to counterbalance, reduce, or quench the exposure modifications. FIG. 3A shows the modification profile 300 within a layer of photoresist at different stages of the process flow of FIG. 1 using a photoresist having a quencher uniformly distributed throughout the layer of photoresist in the dimensions of the surface of the underground it covers. The profile 300 comprises the lobes 302 in region 310 representing the main features of the latent image as well as lobes 304 in regions 312 representing the latent image side-lobes. The latter have concentrations that partially exceed the development threshold level 306 and therefore unwontedly will be partially replicated if not reduced below level 306.

Since the quencher is at least partly consumed in the process of counterbalancing the exposure modification, after exposure, quencher lobes 316 in regions 318 remain since in these regions the exposure modification level did not exceed the initial quencher level.

According to prior art methods of resist processing at the stage of FIG. 3A a fixation or post exposure bake step would be performed therewith replicating part of the lobes 304. However, according to the invention a pre-treatment is performed comprising a heating procedure that does not substantially result in fixation, i.e. temperatures are kept below the threshold temperature.

Figure 3B:
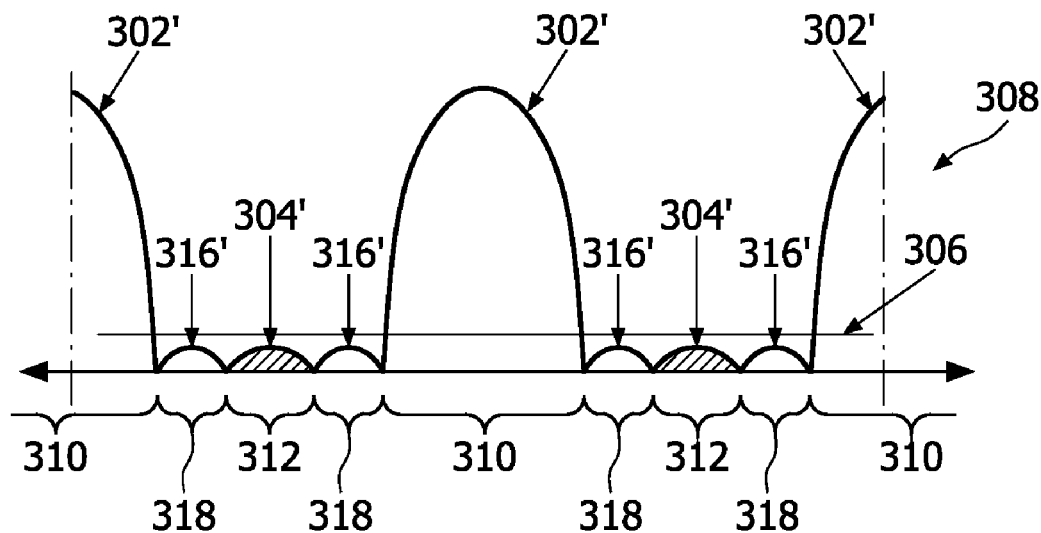

During the pretreatment the remaining quencher 316 in the regions 318 is made to diffuse against its concentration gradient into regions 312 and 310 to counterbalance or reduce the modification of side-lobes 304 in regions 312. In this counterbalancing process the quencher 316 is at least partially consumed. The result after pretreatment is shown in FIG. 3B. Both the quencher 316 in region 318 and side lobe modification 304 in region 312 of FIG. 3A have been reduced to 316' and 304' in FIG. 3B. Moreover, the side lobe modification 304' has been reduced to below the development threshold 306 and therefore will not be developed in the photoresist relief mask layer.

In performing the pretreatment, the quencher 316 that is normally out of range of the exposure generated modifications 304 can now contribute to the quenching of these modifications. Therewith the pretreatment in combination with the quencher can reduce or even annihilate the net concentration of modification in the regions where the concentration of modification is relatively low such as in the side-lobe regions 312. The quencher concentration in the photoresist does not need to be increased, such that exposure doses can remain as before.

Because the quencher will also diffuse into the region 310 of the main lobe 302, the main lobe 302' may be somewhat shrunk with respect to the original lobe 302. However, exposure and quencher levels can be chosen such that it will not decrease below the development threshold 306 after pretreatment.

In this embodiment, the diffusion length of the quencher is important for the counterbalancing or reduction of the exposure modification per unit time. Differences in diffusion lengths of both the modification, which as described here above is the result of exposed and activated photoactive compound and quencher can be controlled by adjusting the time and/or temperature of the pre-treatment. Those skilled in the art will know that the diffusion length is also dependent on the nature of the particles diffusing and the matrix wherein they diffuse. For example, smaller molecules generally diffuse faster than larger ones. Also the shape and/or chemical composition of diffusing species and/or the matrix in which they diffuse is important. The person skilled in the art can think of numerous ways for optimization.

Preferably, the diffusion length of the quencher is larger than that of the exposure modification. This allows effective quenching while preventing spreading of the modification in for example the main feature lobe of the latent image and thus loss of resolution of the latent image.

The photoactive compound may have numerous forms as long as it does not induce modifications that are in any way irreversible during the pretreatment. The photoactive compound may for example result in reversible chemical modification of the photoresist. Alternatively, during exposure an irreversible first chemical modification may occur, as long as it, or its effect can be counterbalanced or reduced using a second chemical modification different from the first one during the pretreatment.

The photoactive compound may be a product such as to release an acidic species upon exposure, while the quencher is a basic substance or vice versa. Also the photoactive compound may release a radical or organometallic reactive species, while the quencher is a radical scavenger or other inhibitor. The photoactive compound may be converted upon exposure in one or more products that change hydrofilicity of the photoresist, while the quencher counteracts this effect by increasing hydrophobicity or vice versa. For example, the photoactive compound may give hydroxy or carboxy (hydrophilic) chemical functionality while the quencher converts this functionality into ester or ether (hydrophobic) functionality by chemically reacting with the hydroxy or carboxylic functionality. Those skilled in the art will think of other suitable quenchers for a given photoactive compound system.

In a further variation, the photoactive compound provides a catalyst during exposure for the fixation such that the photoresist is a chemically amplified photoresist. The quencher is able to counterbalance or inhibit the catalytic chemical reaction at least partly during pretreatment.

Figure 4A:
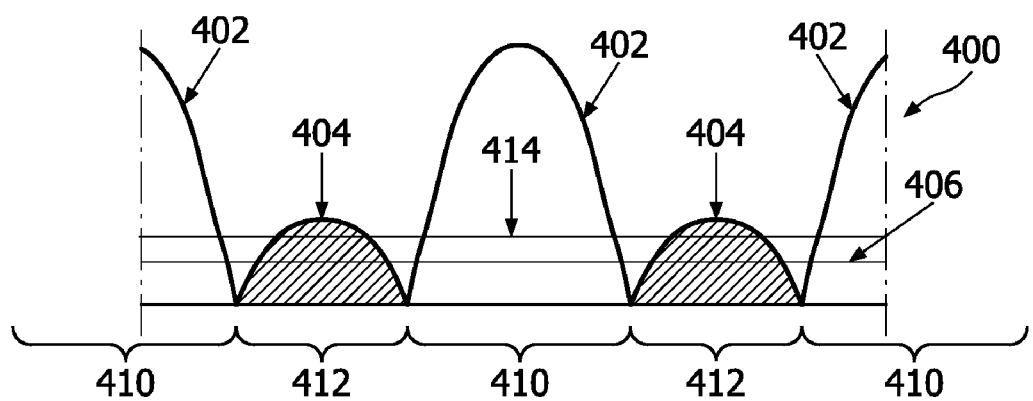

In an embodiment a photoresist is used that comprises at least one precursor quencher not capable of participating in a quenching action. The precursor quencher is made to decompose during the pretreatment to form the actual quencher, that in turn provides the quenching capability. FIG. 4A shows the modification profile 400 within a layer of photoresist at different stages of the process flow of FIG. 1 using a photoresist having a quencher precursor uniformly distributed throughout the layer of photoresist in the dimensions of the surface of the underground it covers. The profile 400 comprises the lobes 402 in region 410 representing the main features of the latent image as well as lobes 404 in regions 412 representing the latent image side-lobes. The latter have concentrations that partially exceed the development threshold level 406 and therefore will be partially replicated if not reduced below level 406.

Figure 4B:
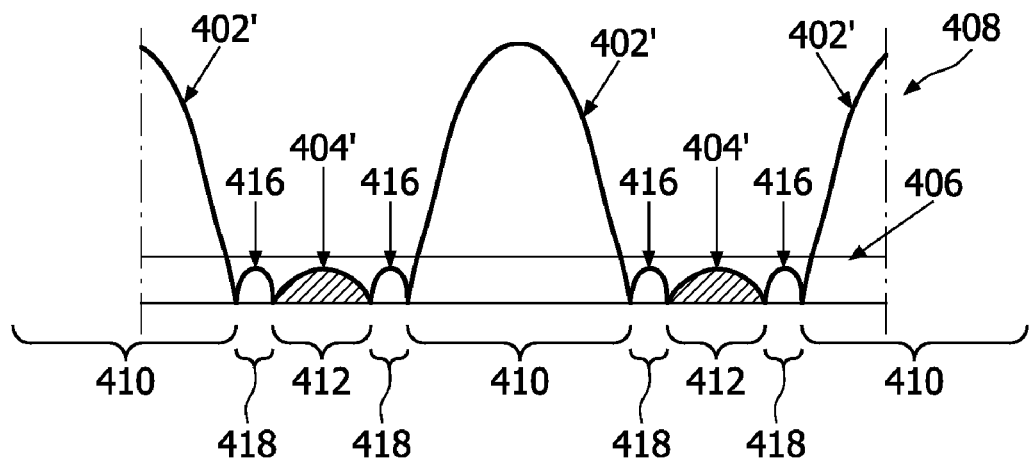

Upon pretreatment, the quencher precursor within the exposed layer of photoresist having the modification profile 400 is made to release the quencher throughout the photoresist layer. The released quencher has a concentration or amount level 414 just after release and before having performed its quenching action. Subsequently in FIG. 4B the resulting modification profile 408 after the quenching is shown comprising side-lobes 404' in regions 412 reduced below the development threshold 406. In this embodiment heating steps for inducing diffusion of the quencher can be omitted and consequently the diffusion of the photoactive compound induced modification is reduced preserving the contrast and resolution of the initial latent images formed upon exposure.

In an embodiment, the quencher precursor is heat sensitive and its decomposition can be accomplished using controlled heating to temperatures higher than used for the soft-bake but lower than used for the post exposure bake. Preferably the heating period is relatively short in view of the aforementioned diffusion prevention. The heating restrictions as mentioned for a previously described embodiment apply to prevent fixation in case fixation is heat induced.

In an embodiment, the quencher precursor is radiation sensitive such that it can be decomposed using exposure with actinic radiation. Preferably, the decomposition of the quencher precursor does not substantially occur during the masked exposure step. In addition, the exposure of the precursor quencher during the pretreatment preferably does not cause activation of the photoactive compound. To this end, the absorption spectrum for decomposition of the quencher precursor and activation of the photoactive compound preferably comprise different wavelength regions such that the latter spectrum comprises the region of smaller wavelength. Absorption efficiency differences can also be used to separate the decomposition and activation reactions.

Examples of photobase generation in the UV wavelength range can be for example found in Pure and Applied Chemistry Vol. 64, (9), 1992, pages 1239-1248. One photobase generator that is activated at lower wavelength than the photoactive compound can be found in for example Macromolecules, Vol. 36, 2003, pages 9252-9256.

In an embodiment, the precursor quencher process is combined with the quencher diffusion process. Note that in FIG. 4B after the pretreatment quencher 416 in region 418 remains. Thus, by adding a heating procedure to the pretreatment for inducing quencher diffusion, the remaining quencher can be made to help reducing the side-lobes 404 in just the same way as described in the embodiment referring to FIG. 3A and FIG. 3B. The modification profile of FIG. 4A is essentially similar to that of FIG. 3A.

The precursor quencher process may also be performed on a photoresist that also comprises one or more quenchers from the start. In that case another combination of embodiments described with reference to FIG. 3 and FIG. 4 are obtained.

The advantage of the quencher precursor is that substantial and possibly complete decoupling of pretreatment and fixation is achieved. In addition, the amount of quencher necessary for reducing side-lobes below the development threshold can be determined by the dose of the uniform exposure during pretreatment and therewith is not bound by a fixed quencher concentration within the photoresist.

Figure 5:
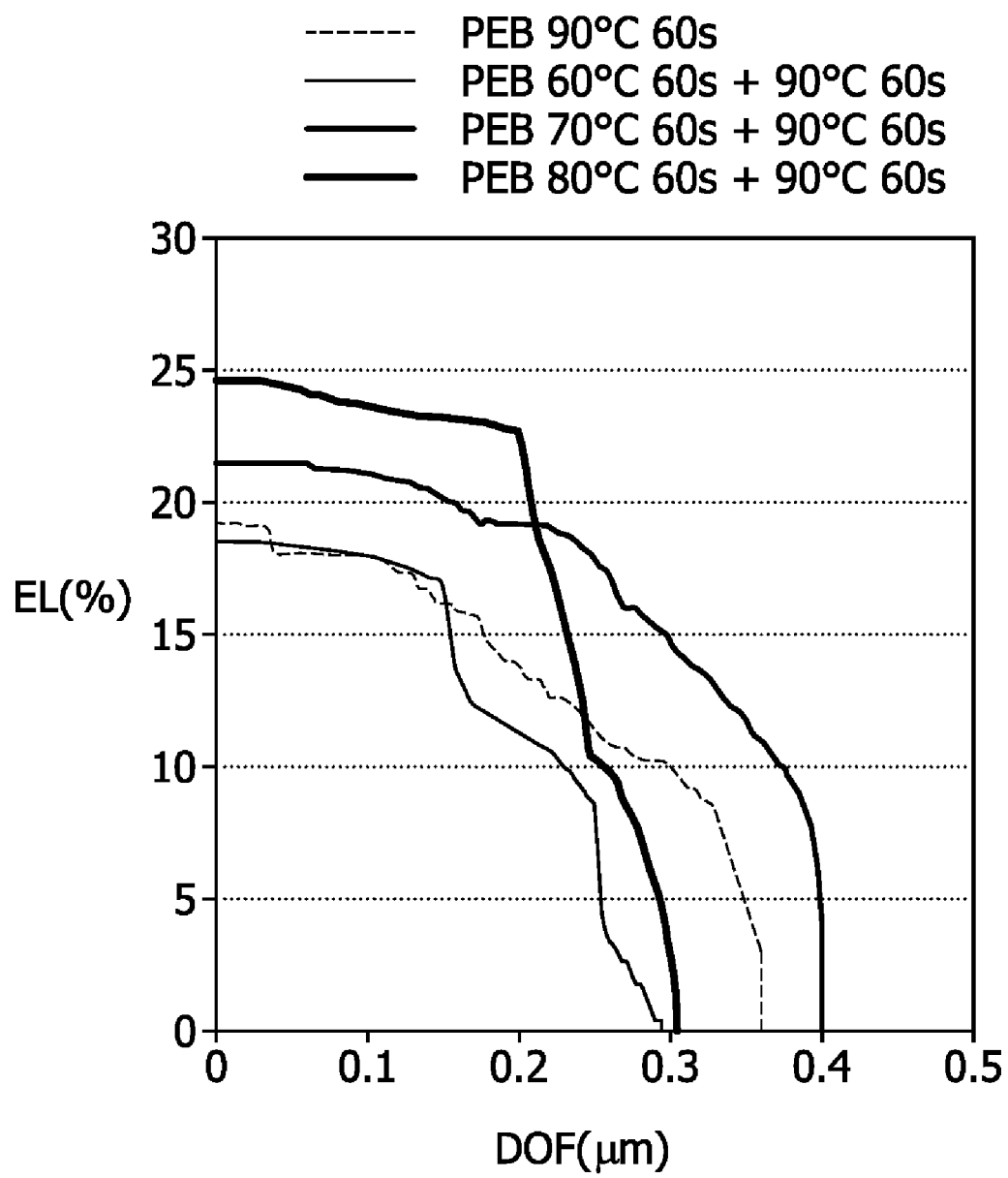
FIG. 5 shows the differences between the methods of resist processing according to the prior art and the invention for a commercially available chemically amplified photoresist.

In an embodiment the effect of the method according to the invention, is illustrated by performing four experiments (I, II, III and IV) with a commercially available chemically amplified photoresist for contact hole printing using attenuated phase shift mask exposure. The results are gathered in FIG. 5 showing exposure latitude (EL) versus depth of focus (DOF) for the experiments. The higher the exposure latitude and/or depth of focus values are, the better the process window is and the better side-lobes are prevented or reduced.

During the experiments all parameters of process steps were kept the same, with the one exception that during the experiments II to IV an additional pretreatment in the form of a pretreatment bake (PTB) was performed at different constant temperatures T(PTB) as given in Table I. The post exposure bake was performed according to vendor recommended specifications and experiment I serves as the reference experiment with which a result according to prior art is obtained.

TABLE I

| Experiment | Pretreatment (PT) | | Post exposure bake (PEB) | |
|---|---|---|---|---|
| | T(PT) [° C.] | PT period [s] | T(PEB) [° C.] | PEB period [s] |
| I | — | — | 90 | 60 |
| II | 60 | 60 | 90 | 60 |
| III | 70 | 60 | 90 | 60 |
| IV | 80 | 60 | 90 | 60 |

Figure 6A:
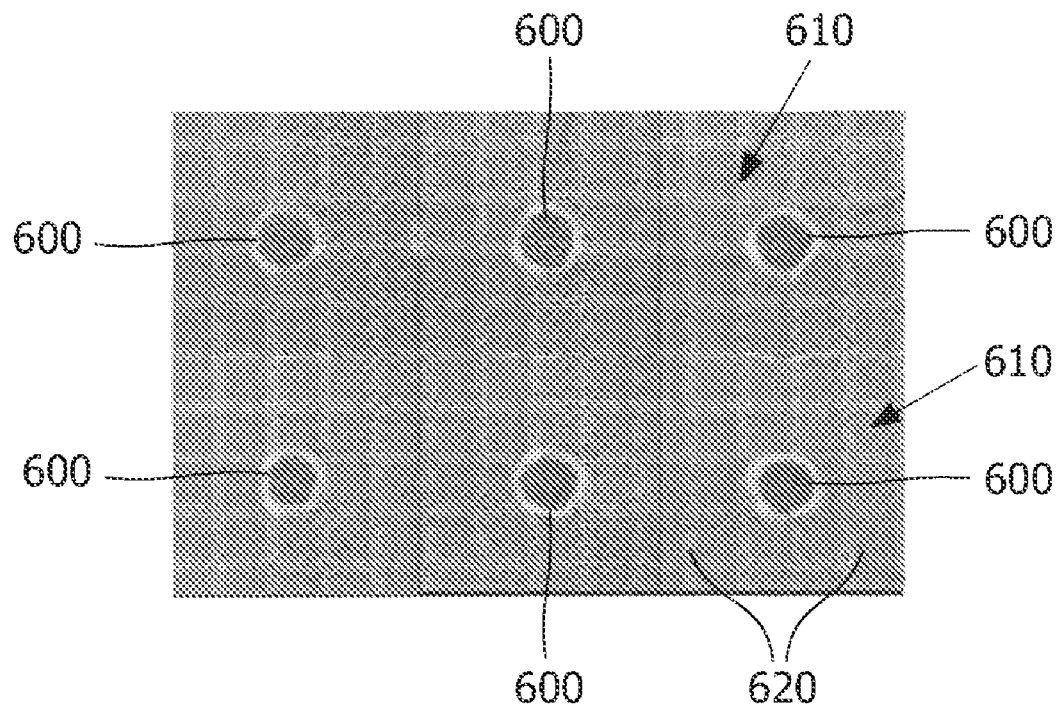
FIG. 6A and FIG. 6B show scanning exposure lattitudeectron microscopy pictures of a contact hole in a chemically amplified photoresist as obtained by standard conditions and conditions according to the invention, respectively.
Figure 6B:
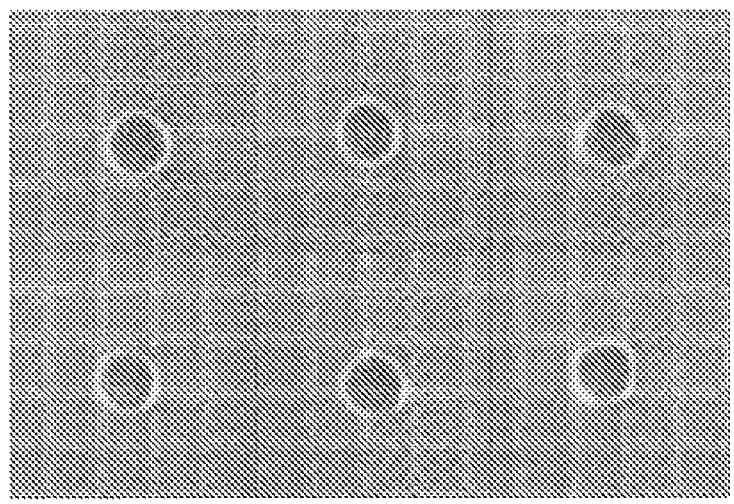

Experiment II does not result in improvement with respect to experiment I. In contrast experiment III gives a significant improvement in both exposure latitude and depth of focus over experiment I, while experiment IV gives improvement on exposure latitude but deterioration of the depth of focus. Thus, while the conditions of the pretreatment bake of experiment II do not provide sufficient energy budget for adequate diffusion of quencher, the pretreatment bake executed at a temperature 20° C. below the critical temperature of 90° C. of the photoresist, gives the desired significant improvement of the process window. The effect of the improvement of the pretreatment on the contact hole replication is illustrated in FIG. 6A and FIG. 6B. While in FIG. 6A scanning electron microscopy pictures are shown of a contact hole 600 in photoresist 610 as obtained by the standard resist processing conditions of experiment I, in FIG. 6B, the same contact hole is shown as replicated using the method of the invention according to the conditions of experiment III. The side-lobes 620 in FIG. 6A are absent in FIG. 6B.

The experiments I to IV described here above are performed according to the process flow depicted in FIG. 1 and the details of process steps and their relevant conditions for obtaining the graphs of FIG. 5 and the pictures of FIGS. 6A and 6B are summarized as follows:

Application of an anti reflective coating (ARC29) of 77 nm thickness at 205° C. for 60 s.

Application of a 270 nm thick chemically amplified photoresist layer. The chemically amplified photoresist is EPIC2330 of Rohm and Haas electronic materials, which is a positive resist comprising a photoacid generator producing a photoacid catalyst and comprising a base as a quencher.

Softbake at 90° C. for 60 s.

Exposure of the photoresist layer using: a 6% attenuated phase shift mask comprising contact hole features of 120 nm diameter and 360 nm pitch, a conventional illumination mode with a σ of 0.4 and a numerical aperture of 0.75.

Pretreatment in the form of a pretreatment bake using the parameters given in Table I.

Post exposure bake according to vendor recommended temperatures of 90° C. for 60 s.

Development according to vendor specified method including puddle in Tetra Methylammomium hydroxide solution.

Between all heating steps, except between pretreatment bake and post exposure bake the samples were cooled to room temperature.

Although the machinery and effect of the method have been illustrated with respect to one particular chemically amplified photoresist and a set of specific processing conditions, it will be clear to those skilled in the art that the method is equally applicable to other photoresists and that other process conditions can be used in accordance with the invention. For example, the method is applicable to an ArF, KrF, I- or G-line type of resist as well as Extreme UV with or without immersion.

Diffusion optimization is regularly performed using simulators known in the art.

The effect of the invention is not only beneficial for the reduction of side-lobes as those skilled in the art will appreciate. The improved processing window may be traded off for process relaxation in the form of lower depth of focus. Alternatively or in addition, the gain in processing window can be used to replicate features and/or spaces between the features with smaller dimensions. Also transmission masks with higher transmission values can be used providing all associated advantages such as increased resolution and lower side-lobe printing level, or even higher throughput.

The method of the invention provides a way for enhancing the process window without having to resort to expensive solutions for achieving the same goal such as mask adjustment or optical proximity corrections (OPC).

In order to identify suitable photoresist and the conditions with which the method of the invention can be applied to these photoresists, the experimental strategy of the previously described embodiment can be employed. In addition, the experimental strategy can be advantageously used to test and find new formulations for photoresists such as described here before with regard to the diffusion, which offer a further improvement of process window.

For the methods according to the invention it may be advantageous to adjust the photoresist in a predefined way. For example, when the quencher must diffuse through the photoresist layer it will be advantageous to control the rate of diffusion or the diffusion length of the constituents of the photoresist with respect to each other especially during the pretreatment.

In an embodiment the photoresist comprises a matrix material in the form of a polymeric material. The exposure modification is a chemical modification of the matrix material or another polymeric material. Being part of a polymeric material, it is difficult for the modification to diffuse. Its rate of diffusion will be low to negligible. Hence, the quencher may be substantially freely chosen as any smaller molecule will be able to diffuse at faster rate than the modification.

The modification may for example be brought about by de-esterification of an apolar ester side group of the matrix or exposure sensitive material in order to transform the side group into one having polar alcoholic or acidic function. The quencher may for example be an oligomer or single molecule that converts these polar functionalities in to less polar or even apolar ones. Such quenchers can be for example acids that reform esters with alcohols, bases that reform esters with acids. Those skilled in the art will be able to devise many more reaction schemes and examples.

Generally a smaller molecule must be construed as one having less carbon and/or oxygen and/or nitrogen atoms than a larger one. Thus a photoactive compound having a linear chain of 6 carbon atoms will diffuse faster than the one having 10 carbon atoms. Hence, if the exposure modification is the release of a photoacid having a structure comprising for example 6 carbon atoms in linear chain, the quencher may be a base having a smaller carbon atom chain in its structure.

Diffusion may also be influenced by the shape of the molecules. For example molecules having liner structures behaving like spaghetti may diffuse slower than those having branched compact structures. This is often strongly related to the apolar or polar nature of the matrix these molecules have to diffuse in. Furthermore, the polarity of the modification and/or the base may be of influence. A polar molecule may diffuse faster in an apolar environment than in a polar environment where it sticks to the environment due to polar adhesion.

Many chemical compositions of photoresists can be thought of and devised without departing from the scope of the invention as defined by the claims.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element or product does not exclude the presence of a plurality of such elements or products. The mere fact that certain measures are recited in mutually different dependent claims does not indicate that the combination of these measures cannot be used to advantage.

The invention claimed is:

1. A method of photolithography comprising the steps of:
   providing a substrate and forming a layer of a photoresist on the substrate,
   performing a first exposure in which a predetermined part of the layer of photoresist is irradiated through a mask having a pattern for forming a latent image of said pattern in the layer of the photoresist,
   performing a pretreatment on the layer of the photoresist to remove a predetermined part of the latent image before performing a fixation, whereby a portion of the photoresist corresponding to a feature to be formed is modified, and
   performing a fixation with which the latent image is converted into an image within the portion of the layer of photoresist that corresponds to the feature.

2. A method according to claim 1 wherein the fixation comprises maintaining of the layer of photoresist at a first temperature, which is equal to or above a threshold temperature, for a predetermined first period, and the pretreatment comprises maintaining of the layer of photoresist at a second temperature, which is lower than the threshold temperature, for a predetermined second period.

3. A method according to claim 1 wherein the latent image is a profile of a modification of the photoresist and the photoresist comprises a quencher, and wherein during the pretreatment the quencher diffuses through the layer of photoresist and is, at least partly, consumed in a process by which the modification is, at least partly, counterbalanced or cancelled out.

4. A method according to claim 3, wherein the photoresist comprises a photoactive compound for generating the modification in the form of a catalyst which catalyzes a transformation within the photoresist during fixation, and wherein during the pretreatment, the quencher disables the catalyst at least partly.

5. A method according to claim 4 wherein the catalyst is an acidic species and the quencher is a base.

6. A method according to claim 1 wherein the latent image is formed by a profile of a modification of the photoresist wherein the photoresist comprises a quencher precursor, which during the pretreatment provides a quencher that at least partly, counterbalances or cancels out, the modification.

7. A method according to 6 wherein the quencher precursor is a photoactive compound and that the pretreatment comprises performing a pretreatment exposure with actinic radiation by which the quencher precursor provides the quencher.

8. A method comprising:
   forming a layer of photoresist on a substrate, the photoresist comprising a photoactive compound that releases a photoproduct upon exposure with actinic radiation, the photoproduct inducing a modification of the photoresist forming a latent image and the photoresist including a quencher configured and arranged to at least partly counterbalance or cancel out the modification in a process wherein the quencher is at least partly consumed, the quencher configured and arranged to diffuse through said layer of photoresist at higher rate than the photoproduct;
   performing a first exposure in which a predetermined art of the layer of photoresist is irradiated through a mask having a pattern for forming a latent image of said pattern in the layer of the photoresist;
   performing a pretreatment on the layer of the photoresist to remove a predetermined part of the latent image before performing a fixation, whereby a portion of the photoresist corresponding to a feature to be formed is modified; and
   performing a fixation with which the latent image is converted into an image within the portion of the layer of photoresist that corresponds to the feature.

9. A method comprising:
   forming a layer of photoresist on a substrate, the photoresist comprising a photoactive compound that releases a photoproduct upon exposure with actinic radiation, the photoproduct inducing a modification of the photoresist and the photoresist including quencher precursor that releases a quencher upon a physical stimulation to at least partly counterbalance or cancel out the modification;
   performing a first exposure in which a predetermined part of the layer of photoresist is irradiated through a mask having a pattern for forming a latent image of said pattern in the layer of the photoresist;

performing a pretreatment on the layer of the photoresist to remove a predetermined part of the latent image before performing a fixation, whereby a portion of the photoresist corresponding to a feature to be formed is modified; and performing a fixation with which the latent image is converted into an image within the portion of the layer of photoresist that corresponds to the feature.

* * * * *